United States Patent [19]

Siebold et al.

[11] Patent Number: 4,876,510
[45] Date of Patent: Oct. 24, 1989

[54] APPARATUS FOR NUCLEAR SPIN TOMOGRAPHY HAVING SUPERCONDUCTING BASE FIELD MAGNETIC COILS AND A RADIATION SHIELD

[75] Inventors: Horst Siebold; Günter Ries, both of Erlangen, Fed. Rep. of Germany

[73] Assignee: Siemens Aktiengesellschaft, Berlin and Munich, Fed. Rep. of Germany

[21] Appl. No.: 193,513

[22] Filed: May 12, 1988

[30] Foreign Application Priority Data

Jun. 4, 1987 [DE] Fed. Rep. of Germany ....... 3718755

[51] Int. Cl.$^4$ ........................................... G01R 33/20
[52] U.S. Cl. .................................... 324/318; 505/850; 324/319
[58] Field of Search ................ 361/19; 335/216; 505/850; 324/300, 307, 309, 318, 319, 320, 322, 315; 128/653

[56] References Cited

U.S. PATENT DOCUMENTS

| 4,237,507 | 12/1980 | Meierovich | 505/850 |
| 4,266,194 | 5/1981 | Hlavka | 324/315 |
| 4,766,378 | 8/1988 | Danby et al. | 324/307 |
| 4,768,008 | 8/1988 | Purcell et al. | 335/216 |
| 4,783,628 | 11/1988 | Huson | 335/216 |
| 4,822,772 | 4/1989 | Huson | 335/216 |

FOREIGN PATENT DOCUMENTS 0144171 11/1984 European Pat. Off. .

OTHER PUBLICATIONS

19 J. Phys E: Sci. Instum (1986, pp. 876–879).
19 J. Phys. D: Appl. Phys. (1986) L129–L131).
Supraleitung 3rd Ed. Weinheim 1984, pp. 140–166.
Physics Today (Apr. 1987) pp. 17–23.
Journal of the American Chemical Society, vol. 109, No. 9 (1987) pp. 2848–2849.
Applies Physics Letters, vol. 51, No. 11 (Sep. 14, 1987) pp. 852–854.

Primary Examiner—Michael J. Tokar
Attorney, Agent, or Firm—Kenyon & Kenyon

[57] ABSTRACT

Magnet coil system for nuclear spin tomography has superconducting coils for generating a homogeneous magnetic base field and nonsuperconducting coils within an interior region defined by the base field coils for developing magnetic field gradients. At least one cooled radiation shield of electrically and thermally conductive material is arranged between the gradient coils and the superconducting base field coils. To prevent eddy currents started in the radiation shield from distorting the gradient fields, the radiation field contains superconducting material of a "second kind" that is a high temperature superconductor. The superconductor is in a nonsuperconducting state at the start of an excitation process for the base field coils and in a superconducting state during the undisturbed operation of the magnet coil system.

15 Claims, 1 Drawing Sheet

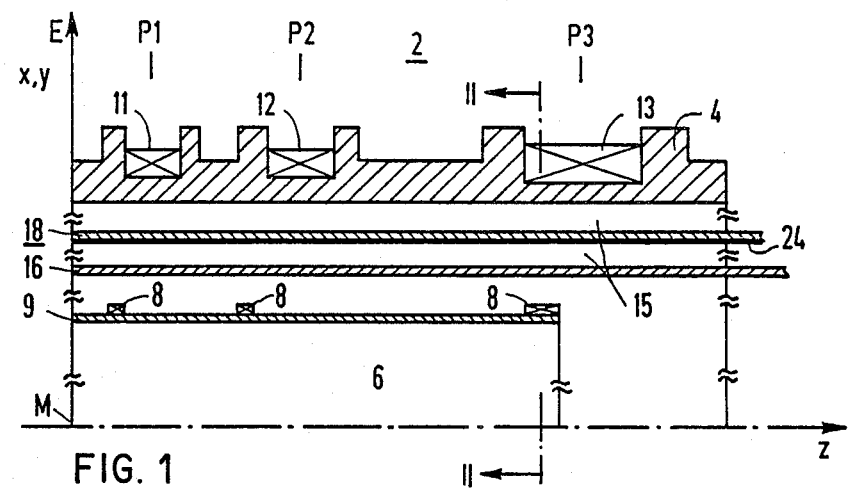
FIG. 1
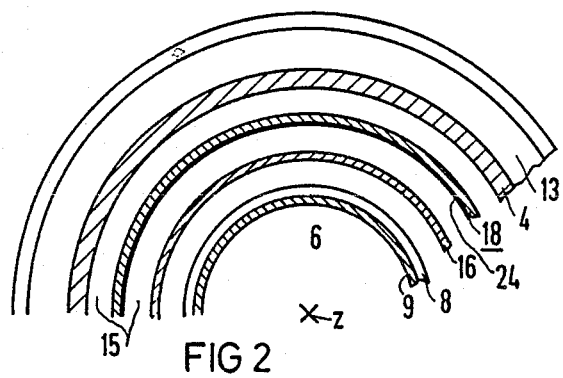
FIG 2
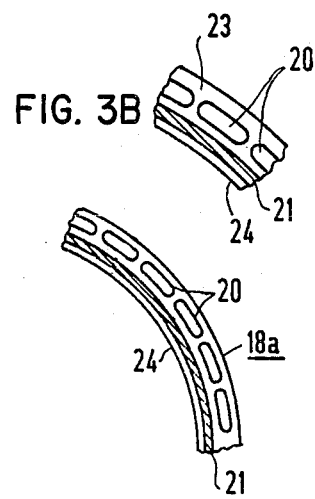
FIG. 3B
FIG. 3A
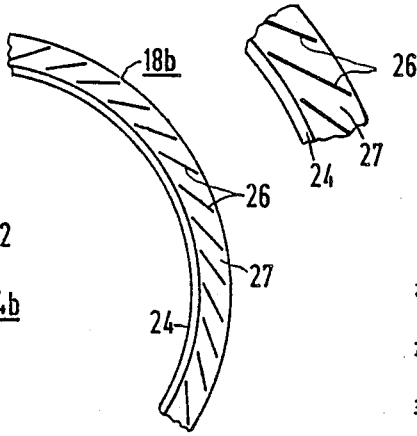
FIG. 4B
FIG. 4A
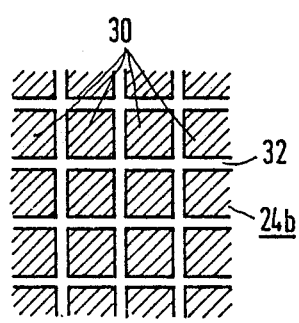
FIG. 6
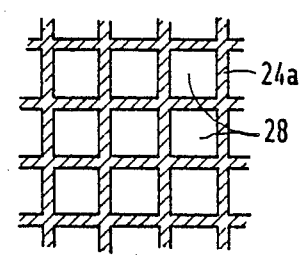
FIG. 5

APPARATUS FOR NUCLEAR SPIN TOMOGRAPHY HAVING SUPERCONDUCTING BASE FIELD MAGNETIC COILS AND A RADIATION SHIELD

BACKGROUND OF THE INVENTION

1. Field of the Invention

The present invention relates to an apparatus for nuclear spin tomography that uses superconducting magnetic coils to generate a homogenous magnetic base field. Normal conducting coils within the interior of the superconducting base field coils develop magnetic field gradients. At least one cooled radiation shield of electrically and thermally conducting material is arranged between the normal conducting gradient coils and the superconducting base field coils.

2. Description of Related Art

Image producing diagnostic methods have been developed in the field of medical technology to measure integral resonance signals of nuclei of a given chemical element in a body or part of a body such as a human body. The spatial spin density or relaxation time distribution obtained in this manner can be used to construct an image similar to an x-ray tomogram in computer tomography. Similar methods are generally known under the designation "nuclear spin tomography" or Nuclear Magnetic Resonance (NMR) tomography, also called "Magnetic Resonance Imaging (MRI) or Magnetic Resonance Spectroscopy (MRS).

Nuclear spin tomography requires a magnetic field that is produced by a base field magnet. A body or the part of a body to be examined is placed along an axis that generally coincides with the orientation axis of the magnetic base field. The base field must be sufficiently homogeneous in a suitable imaging or examination zone. The magnetic induction in this zone can amount to several Tesla. Such high magnetic induction, however, can be generated only with superconducting magnet coils which must be accommodated in a suitable cryo system comprising at least one cooled radiation shield that limits heat input from the room temperature that reaches the superconducting base-field coils. The design of the radiation shield is generally governed by thermal considerations and made of highly electrically conductive material. Stationary or pulsed gradient fields are superimposed on the magnetic base field. The superimposed field is formed by nonsuperconducting coils that are arranged within the interior of an area defined by the cryo system of the base field coils and generally operate at approximately room temperature. A separate antenna is further require to excite the individual atom nuclei in the body or the part of a body to perform a precession motion. Thus, a high frequency a-c magnetic field can be generated for a short time. Optionally, this antenna can also receive the high frequency signals generated by the excited atomic nuclei.

According to the European Patent Application 0,144,171, the radiation shield of a superconducting base field coil system or its cryo system is made of a electrically highly conducting material such as aluminum. The nonsuperconducting gradient coils, however, generates eddy currents in the radiation shield that produce reaction gradient fields in the useful volume of the examination zone. These eddy currents decay with a time constant $\tau$ which is generally between 0.05 and 0.3 seconds due to the finite conductivity of the radiation shield. This leads to a pulse distortion of the gradient field, or a frequency response curve of the sensitivity of the coil system defined as the gradient field strength per operating current which increases below a frequency limit $f_g$ toward low frequencies $f < f_g = (2\pi\tau)^{-1}$. The eddy currents thus reduce resolution in nuclear spin tomography unless countermeasures are taken. It is generally not feasible to make the radiation shields non-shielding by using, for example, poorly conductive material or slots. The gradient fields can penetrate these shields and generate heat in the helium chilled region of the superconducting base field coils. This heating is particularly disturbing at their very low operating temperature.

Primarily two countermeasures are known in the art. The first method has the magnetic field of the eddy currents induced in the radiation shield at about 10–30% of the direct gradient field. The magnetic field of the eddy currents forms its own gradient field which is opposed to the original field and therefore attenuates it. This effect can be taken into consideration in designing the gradient coils to produce a combined gradient field of high spatial quality. (See, "J. Phys. E", Vol. 19, 1986, pages 876 to 879). The frequency behavior of the eddy currents can be compensated for by using a frequency correction of the current pulses that feed the gradient coils. In general, however, such a correction is unique to each magnet system since the conductivity of the laminations used as the radiation shield is scattered at low temperatures. In addition, it cannot be assured that the spatial distribution of the eddy currents remains unchanged during the decay. The separability of the space and time behavior of the gradient field with respect to the radiation shield, assumed with this countermeasure, does not always exist.

A second countermeasure it is known, for example, from "J. Phys. D", Vol. 19, 1986, pages L129 to L131. This countermeasures uses an additional system of gradient coils that are positioned between the primary gradient coil system and the radiation shield and positioned as close as possible to the shield. It is possible to produce an improved frequency curve which is at least largely smooth. The crowded space conditions, however, in the interior of the solenoid-like superconducting base field coil lead to difficulties. Each negatively excited additional gradient coil is located very close to the corresponding primary coil since its radii must be only about 20% larger in radius. As a consequence, the gradient field action is largely cancelled. Therefore, distinctly higher supply voltages and currents are necessary than with the countermeasures explained above because a magnet coil system designed according to this countermeasure starts eddy currents in the cold, highly conductive radiation shield. These eddy currents cost less Joule power than the currents in the additional gradient coils that are at approximately room temperature. The inductive reactive power is smaller with the first countermeasure because the radiation shield is located radially further outward than the additional gradient coils used in the second countermeasure. Present and future pulse sequences, however, require even stronger gradient fields, especially for fast image generation. The electronic power circuitry for feeding the gradient coils becomes a correspondingly more expensive part of the overall system, especially for using the second countermeasure.

SUMMARY OF THE INVENTION

The present invention develops the magnet coil system of the type mentioned at the outset to reduce the problems caused by the known countermeasures that attempt to reduce the formation of eddy currents in the radiation shield. The intensity and homogeneity of the base field should be largely unchanged.

The phrase "superconductive material of the second kind" is defined to be generally any material where, in an undisturbed operating state, the magnet coil system has a current density or current carrying capacity in the stationary field of the base field coils and in the a-c field of the gradient and RF coils that is sufficient to carry the currents induced therein at least largely without loss and without the latter being attenuated in time due to electric resistance. The magnetic base field should be capable of penetrating the superconductive material (see, for instance, the text by W. Buckel: "Supraleitung", 3rd Edition, Weinheim, 1984, pages 140 to 166).

The advantages associated with the embodiment of the magnet coil system according to the present invention include the ability of the thermal radiation shield to also act as a gradient shield. The base field deviates from the shield material only slightly due to a small residual diamagnetism because a superconductor material of the second kind is used to limit the change in the useful volume in the base field of the magnet. The gradient fields induced during operation cause currents to start in the superconducting radiation shield that are not attenuated by Joule losses so that the frequency curve is largely smooth down to the lowest frequency. The advantages of the two mentioned countermeasures are combined practically in the magnet coil system according to the invention.

An additional advantage is that the radiation shields of the magnet coil system can be constructed of metallic parts such as laminations which make poor circular electrical conductors. The shield is constructed, for example, by forming longitudinal slots. Such laminations cannot generate large eddy currents or strong forces during quenching of the base field magnet such as happens during an unintended transition from a superconducting state to a nonsuperconducting state.

It is a further advantage of the present inventions that the time dependent external interference fields that occur after a shimming (homogenizing) of the base field magnet are largely excluded from the measurement volume.

BRIEF DESCRIPTION OF THE DRAWINGS

FIGS. 1 and 2 show a magnet coil system according to the present invention with an associated radiation shield;

FIGS. 3A, 3B, 4A and 4B show two possible embodiments for the radiation shield of the present invention; and FIGS. 5 and 6 show possible coatings for such a radiation shield.

DETAILED DESCRIPTION

The magnet coil system of the present invention advances on known embodiments of image-producing apparatus for nuclear spin tomography (see, for instance, the mentioned European Patent Application 0,144,171). Such a magnet coil system generally contains several pairs of superconducting coils for generating a magnetic base field in the direction of the z-axis of an orthogonal x-y-z coordinate system. The base field is sufficiently homogenous at the location of an imaging area at the center M of the origin of the coordinate system. The magnet coil system permits access to the axis of this homogeneous imaging area such as for a body to be examined. For example, a human body is placed in the field zone along the z-axis. Suitable magnet coil systems are therefore preferably designed with rotational symmetry.

The magnet coil system for nuclear spin tomography is partially indicated schematically as a longitudinal section designated generally as 2. The magnet coil system has six annular superconducting base field coils aligned along the z axis. Each of the coils is arranged in symmetric pairs with respect to the plane E subtended by the x-y axis of the coordinate system to produce three pairs, P1, P2 and P3 of base field coils. FIG. 1 details only the parts of the magnet coil system 2 that are located on the one side of this symmetry plane E and that are above the z-axis. The coil pair P1 is therefore shown by base field coil 11, the coil pair P2 by base field coil 12 and the coil pair P3 by its base field coil 13. The base field coils of the magnet coil system can be arranged in corresponding slots of a solid hollow cylindrical coil carrier or forms 4 of nonmagnetic material. Within the cylindrical interior 6 of the magnet coil system 2 defined by the coil pairs P1 to P3 or their common coil forms 4 can further be arranged nonsuperconducting gradient coils that are known per se. In addition, nonsuperconducting RF coils are also provided. FIG. 1 indicates, for example, only saddle shaped x-y gradient coils 8. These gradient coils 8 are illustrated as fastened on a tubular support 9 and are approximately at room temperature. A thermal shield between them and the lower temperature superconducting base field coils 11-13 is thus required. An annular vacuum space 15 around the coil serves this purpose. Vacuum space 15 encloses a suitable vacuum vessel 16 comprising at least one thermal radiation shield 18 which is also designated as a cold shield in accordance with the present invention.

FIG. 2 shows a cross section through the magnet coil system 2 of FIG. 1 along plane II—II.

According to the invention, the radiation shield 18 shown in FIGS. 1 and 2 is to be constructed from superconducting material of the second kind which is a so-called high $T_c$ (critical temperature) superconductor. During excitation of the base field coils 11-13 this shield 18 must be warmer than its transition temperature $T_c$. Otherwise, a circular current flowing in the opposite direction would be induced by a strong flux coupling and would attenuate the magnetic base field in the region of the interior 6. Optionally, a separate heating device can be provided at the radiation shield to adjust suitable temperature conditions during the excitation phase.

An alternate embodiment comprises substantially decoupling the radiation shield during the exciting phase of the superconducting base field coils from the optional cold supply. The base field coils start to become excited only after such a measure. The superconducting coating on the shield then acts as a secondary winding to the winding of the base field coils. A current flowing in the direction opposite the magnet current is induced in such a way that the magnetic flux change in the interior of the magnet remains zero. The thickness of the superconducting layer is now advantageously made to exceed its current carrying capacity before reaching the operating current of the magnet. The magnetic flux in the form of a so-called flux jump then penetrates into the interior of the shield. The magnetic energy is then released and heats the entire shield above the transition temperature $T_c$. The superconducting shielding currents are extinguished. A separate heating device can therefore advantageously be dispensed with. The base-field coils are then finally brought to their operating current and the radiation shield is again thermally coupled to the cold supply.

A corresponding thermal switching process is eliminated if the design causes the radiation shield to be weakly coupled to the cold supply. A weak coupling may happen through radiation exchange with the environment.

The base field coils are then brought in a known manner to a "continuous persistent short circuit mode" at the end of the excitation starting phase. Circular eddy currents are then no longer induced in the radiation shield. The base field coils can cool to operating temperature which naturally must be below the transition temperature $T_c$ so that it can be transferred again into the superconducting operating state. Since the superconductive material is preferably a superconductor of the second kind, the magnetic field generated by the base field coils is adversely affected only slightly due to its small diamagnetism. There is advantageously also no attenuation of the eddy currents started by the gradient fields in the superconducting radiation shield.

The radiation shields of the helium cooled superconducting magnet coils are generally at temperature levels between 20 K and 80 K. These coils include, for example, NbTi or Nb$_3$Sn superconductors. The shields are cooled either with helium exhaust gas or directly with liquid nitrogen. It is also possible to thermally couple their end faces to corresponding cold parts of the magnet coil. The design of these radiation shields of the present invention are therefore particularly suited to superconductors of metal oxide compounds formed from the material system Me1-Me2-Cu-O that have a high transition temperature $T_c$ (see, for instance, "Physics Today", April 1987, pages 17 to 33). Me1 is chosen from the group of rare earth metals such as La or Y. Me2 is chosen from the group of earth alkali metals such as Ba, Sr or Ca. Thus, the material system Y-Ba-Cu-O, for example, has an observed transition temperature of around 90° K. ("Journal of the American Chemical Society", Vol. 109, No. 9, 1987, pages 2848 and 2849). The superconducting phases of these materials have a structure similar to ceramic oxides and thus are called ceramic superconductors. These high-$T_c$ superconductors also exhibit a behavior in an external magnetic field corresponding to the known superconductors of the second kind; i.e., they shield the magnetic field strength only down to a lower critical value $H_{c1}$. Field strengths between $H_{c1}$ and an upper critical value $H_{c2}$ enable the external field to penetrate the superconductor without destroying the superconducting property. The nonsuperconducting state is forced only at field strengths above $H_{c2}$.

According to the present invention, the radiation shield comprises material such as a high-$T_c$ superconductor. In FIG. 3, part of a corresponding radiation shield is schematically shown as a cross section and designated as 18a. This shield comprises essentially a multiplicity of thin walled tubes made from, for example, a steel alloy. These tubes extend parallel to each other in the axial (z) direction and are disposed closely next to each other in the circumferential direction. However, the tubes should advantageously be insulated from each other. According to the embodiment shown, the individual tubes are placed on a thin, electrically insulated tubular carrier for this purpose and secured, for example, by cementing. The corresponding adhesive layer assures that tubes 20 are electrically insulated from each other and from the tubular carrier 21 that is designated as 23 in FIG. 3. A design with longitudinal slots is thus obtained which, in the case of quenching the base field magnet, does not generate large eddy currents. A thin superconducting layer 24 or a thin coating or other correspondingly thin structure of the superconducting material is then applied to the surface of the thin tubular carrier 21. A coolant flowing through the cooling tube such as helium exhaust gas or liquid nitrogen maintains the superconductor properties of the layer 24 in the operating state of the magnet system.

Additional heating devices, not shown in FIG. 3, can be attached to the radiation shield 18a during the excitation phase to ensure that layer 24 is not superconducting. This heating device could also comprise a medium flowing through the tubes 20 that has a temperature that is sufficiently high to heat the layer 24 above the transition temperature $T_c$ during the excitation phase. A special heating device, however, is not necessary if superconducting layer 24 is designed so that the excited shield currents exceed its current carrying capacity.

Thin tubular carrier 21 can comprise a poor electrical conducting lamination such as steel or plastic. It may also be possible to eliminate the tubular carrier 21 if the cooling tubes 20 represent a sufficiently stable cylindrical structure and are mechanically connected to each other. In this case the thin superconducting layer 24 is preferably directly applied to the inside of the hollow cylinder.

It is also conceivable to coat a conventional carrier with a special superconducting material that is a highly electrically and thermally conducting unslotted radiation shield made from, for example, an aluminum carrier. However, this design no longer obtains the advantage of smaller forces on the eddy currents in the shield if the base field magnet is quenched.

FIG. 4 shows a further embodiment of the longitudinal slotted radiation shield according to the invention. The schematic diagram corresponds to FIG. 3. The radiation shield designated with 18b comprises metal strips that are electrically insulated from each other and overlap each other as seen in the circumferential direction. The metal strips 26 are connected by electric insulation 27 to form a tubular structure. The metal strips 26 must comprise highly heat conducting material so that the thermal load can be removed in the axial (z) direction to the end faces of the radiation shield. These end faces are thermally coupled to correspondingly cold parts of the magnet coil system. A superconducting layer 24 of a suitable high $T_c$ superconducting material is again deposited on the surface of this tubular structure.

In all embodiments it is somewhat more advantageous to arrange the superconducting layer on the inside of any tubular carrier rather than on the outside. In this way the gradient field need not diffuse only through the metal of the carrier at the heat inputs for high operating gradient frequencies.

The schematic top view shown in FIG. 5 shows the superconducting layer 24 depicted in FIGS. 3 and 4. It is to be understood that layer 24 need not necessarily be planar. Rather, a lattice structure 24a can be formed with rectangular, diamond shaped, or ring shaped meshes 28. These meshes need not be particularly uniform. The size of the meshes can range from microscopic to approximately hand size. The dimensions and the shape of the meshes 28 are chosen so that circulating currents that are generated in them are exactly large enough to prevent the passage of the magnetic flux generated by the gradient coils in the direction of the base field coils.

If, in particular, wires or ribbons of the specific superconductive material are used for the lattice structure 24a, they must be connected at the nodes or overlap zones to obtain the best possible conductivity. This objective can be obtained, for example, by squeezing, ultrasonic welding, soldering with superconducting solder or a combination of these methods. Such bonding techniques are generally known for connecting superconductors in the production of magnets.

In addition to the lattice structure 24a shown in FIG. 5, it is also possible to provide a radiation shield having individual prefabricated planar elements of the specific superconductive material. A pertinent embodiment is shown in the top view shown in FIG. 6. This Figure shows a layer or coating structure 24b of the specific superconducting material comprising individual planar elements 30. These elements need not necessarily be electrically connected to each other. This embodiment further assumes narrow insulating spaces 31 are provided between the individual elements 30, as shown exaggerated in the figure. Instead, the planar elements can also be arranged so that they overlap in narrow edge strips without being electrically connected to each other. This construction provides a particularly good shielding action. The individual planar elements 30 can be made, for example, with plates that are approximately the size of the palm of the hand. These plates comprise a substrate material which is suitable as the carrier for the known superconducting high $T_c$ materials. The substrate materials can comprise $Al_2O_3$, $ZrO_2$, MgO or preferably $SrTiO_3$ (see, for example, "Applied Physics Letters", Vol. 51, No. 11, Sept. 14, 1987, pages 852 to 854). In addition, a similarly coated foil material may also be used as the substrate. The superconductive material obtained can form planar elements 30 on the inside or outside of the radiation shield and can be attached, for example, by cementing.

What is claimed is:

1. A magnet coil system for a nuclear spin tomography apparatus comprising;
    superconducting base field coils for generating a homogeneous magnetic base field, said superconducting base field coils defining an interior region;
    gradient coils that are not superconducting positioned within said interior region for developing magnetic field gradients;
    at least one cooled radiation shield that is electrically and thermally conducting and comprises a superconducting material of a second kind having a high superconducting transition temperature; and
    said shield is positioned between said gradient coils and said superconducting base field coils and has a nonsuperconducting state during a starting process and a superconducting state during undisturbed operation of the magnetic coil system.

2. A magnet system as claimed in claim 1, wherein said superconducting material is applied as a thin layer or coating on the inside or outside of said radiation shield.

3. A magnet system as claimed in claim 2, wherein said superconducting layer or coating of said radiation shield has the structure of a mesh.

4. A magnet system as claimed in claim 3, wherein said mesh structure comprises superconducting wires or ribbons that are connected to each other in a highly electrically conducting manner.

5. A magnet system as claimed in claim 2, wherein said superconducting layer or coating of said radiation shield comprises several prefabricated planar elements.

6. A magnet system as claimed in claim 5, wherein said planar elements of said superconducting layer or coating are plates or foils that are coated with said superconducting material.

7. A magnet system as claimed in claim 5, wherein said planar elements overlap in narrow edge strips.

8. A magnet system as claimed in claim 6, wherein said planar elements overlap in narrow edge strips.

9. A magnet system as claimed in claim 1, further comprising means for heating said radiation shield to heat said superconductive material above its critical transition temperature during the starting process for said base field coils.

10. A magnet system as claimed in claim 1 wherein said superconducting material has dimensions chosen so that, during the starting process of said base field coils and before an operating current is reached, a critical current carrying capacity of the superconducting material is exceeded.

11. A magnet system as claimed in claim 1, further comprising
    means for cooling said base field coils; and
    means for disconnecting said radiation shield from said cooling means during said starting process.

12. A magnet system as claimed in claim 1, wherein said radiation shield comprises a longitudinally slotted design formed from metallic parts.

13. A magnet system as claimed in claim 1, wherein said radiation shield further comprises thin walled coolant tubes that are arranged in an axial direction of the shield parallel to each other and connected to each other in a poorly electrically conducting manner.

14. A magnet system as claimed in claim 1, wherein said radiation shield contains thin metal strips of thermally highly conducting material that are arranged in an axial direction of the shield parallel to each other and overlap as seen in a circumferential direction of the shield while they are insulated electrically from each other.

15. A magnet system as claimed in claim 1, wherein said superconducting material contains a superconducting Y-Ba-Cu-O phase.

* * * * *